(12) United States Patent
Yang

(10) Patent No.: US 6,770,833 B2
(45) Date of Patent: Aug. 3, 2004

(54) MICRO-WELDING ELECTRODE

(76) Inventor: Shi tong Yang, No. 1 Hedong, New Road, Fangcun Dist, Guangzhou (CN)

(*) Notice: Subject to any disclaimer, the term of this patent is extended or adjusted under 35 U.S.C. 154(b) by 0 days.

(21) Appl. No.: 10/171,065

(22) Filed: Jun. 11, 2002

(65) Prior Publication Data
US 2002/0185471 A1 Dec. 12, 2002

(30) Foreign Application Priority Data

Jun. 12, 2001 (CN) .......................... 01114808 A

(51) Int. Cl.[7] .............................................. B23K 11/30
(52) U.S. Cl. .................... 219/56.21; 219/86.9; 219/119
(58) Field of Search ............................. 219/56.1, 56.21, 219/56.22, 86.9, 119

(56) References Cited

U.S. PATENT DOCUMENTS

| 3,320,401 | A | * | 5/1967 | Zachry et al. | 219/119 |
|---|---|---|---|---|---|
| 3,342,972 | A | * | 9/1967 | Penberg | 219/119 |
| 3,348,018 | A | * | 10/1967 | Wood | 219/119 |
| 3,435,184 | A | * | 3/1969 | Schroeppel et al. | 219/119 |
| 3,478,190 | A | * | 11/1969 | Dawes | 219/86.9 |
| 4,171,477 | A | * | 10/1979 | Funari | 219/56.21 |
| 4,465,913 | A | * | 8/1984 | Stokoe et al. | 219/56.1 |
| 4,504,723 | A | * | 3/1985 | Gobran et al. | 219/85.18 |
| 4,950,866 | A | | 8/1990 | Kojima et al. | 219/137 PS |
| 5,115,111 | A | * | 5/1992 | Fries et al. | 219/56.21 |
| 5,360,958 | A | * | 11/1994 | Bogue et al. | 219/86.51 |
| 5,950,070 | A | * | 9/1999 | Razon et al. | 438/113 |
| 6,100,511 | A | | 8/2000 | Kempe | 219/679 |
| 6,369,346 | B1 | | 4/2002 | Gall | 219/117.1 |

FOREIGN PATENT DOCUMENTS

JP 55-150247 * 11/1980 ........... H01L/21/60

* cited by examiner

Primary Examiner—Kiley Stoner
Assistant Examiner—Kevin P. Kerns
(74) Attorney, Agent, or Firm—Intellectual Property Law Group LLP; Otto O. Lee; Juneko Jackson

(57) ABSTRACT

A micro-welding electrode which is installed in a welding machine and applied to the electronics industry and spot electric welding industry. The micro-welding electrode includes two integrated electrodes which are made from high-temperature-resistant materials and has a placed insulation between the two electrodes. The insulation between the two parallel electrodes is an insulative chipbonder with the function of agglutination, fixation, insulation and separation, and allows for dispensing with an insulative rivet. Simultaneously, the tip of the two parallel electrodes is positioned into mutual Ohm contact. Not only can the electrode directly weld enameled wires but also has the quality of effectively welding bare wires, sheet metal and metal tapes. The electrode has a simple and reliable construction, is low in production cost, has a good quality of welding and allows for high work efficiency.

7 Claims, 2 Drawing Sheets

(a)

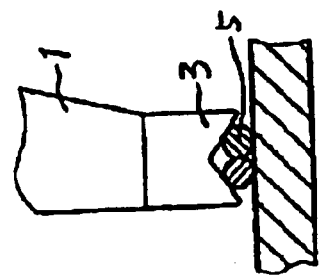
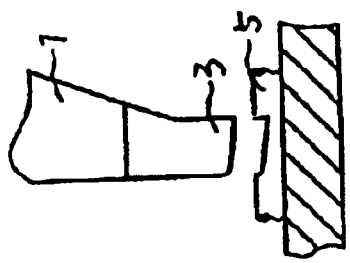
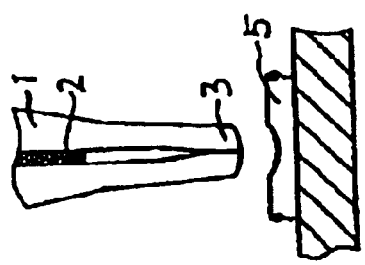
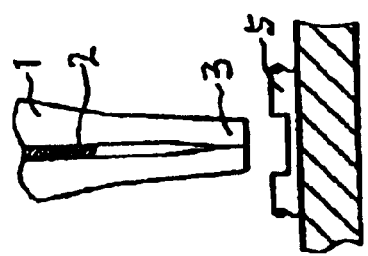
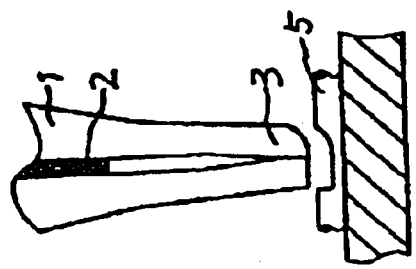
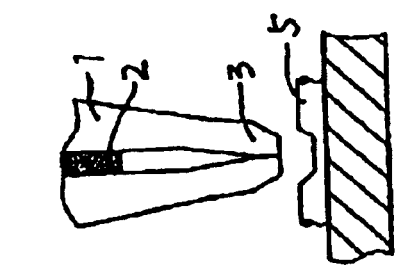
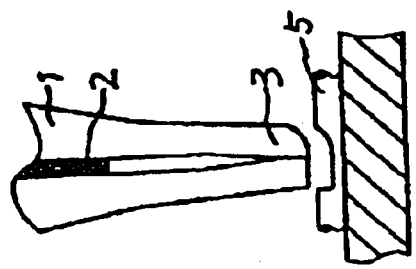

MICRO-WELDING ELECTRODE

BACKGROUND

Field of Invention

This invention deals with a kind of micro-welding electrode that may be used in the electronic industry and the micro-electronic industry.

Micro-welding is a welding process that briefly passes an electric current through two wires that are to be welded together. The electric energy from the current that is transformed into heat melts the two wires and makes an integration. The existing micro-welding electrode (See FIG. 1) used in the electronic industry and micro-electronic industry is made up of two parallel electrodes that are made from high-temperature-resistant metal. Generally, the two parallel electrodes are machined into symmetric 2–5 mm semi-cylinders that are about 20–40 mm in total length. The arrangement near the electrode's tip, which is 5–15 mm, is shaped as a 6°–12° cuneiform, and the tip is machined into a rectangular or square cylinder. Mica is the material used for insulation 2 between the two parallel electrodes. Two insulation rivet holes are individually machined on each electrode. The two parallel electrodes are then connected and fixed using insulating rivet 4. Because the tip is fairly small, the rivet holes must be precisely matched which raises production costs extremely high. The area that the rivets take up reduces the contact area of the electrode and the electrode's clamp, but it also increases the contact resistance. If the machining process for the rivet holes leaves burrs, or if a rivet head protrudes, the contact between the electrode and the electrode clamp could be poor. Furthermore, the electrode's tip (3) can only be made into one plane, and the insulation required for each electrode creates further restrictions. These restrictions limit the standard electrode to performing only simplistic welding of bare wires, ribbons, and sheet metal.

SUMMARY

The purpose of the embodiments of the present invention is to overcome the above limitations and provide the electronic industry and the micro-electronic industry with a type of micro-welding electrode that is simple and easy to manufacture, that has stable and reliable product quality, that has a low production cost, and that simultaneously creates an improved electrode tip that may perform a greater variety of functions.

In one embodiment of the present invention, the micro-welding electrode comprises two integrated parallel electrodes made from high-temperature-resistant metal materials. The insulation between them in this embodiment is made of insulation, which functions as agglutination, fixation, insulation and as a separator.

In an alternative embodiment, the tip of the two parallel electrodes is in mutual Ohm contact, with the insulation separating the rest of the electrodes.

Another embodiment of the invention uses a mutual Ohm contact with a contact resistance of 200 milliohms or less for the tip of the two parallel electrodes.

In an alternative embodiment, the shape of the electrodes' tip may be a plane, a single side type arc, a plane on one side and an arc on the other side, an incline, a "V", a concave arc, or a cuneiform.

In yet another embodiment, the gap created between the electrodes is filled with insulation, and the distance of the gap between one electrode to the other measures 0.02–0.15 mm.

These and other embodiments of the present invention are further made apparent, in the remainder of the present document, to those of ordinary skill in the art.

BRIEF DESCRIPTION OF THE DRAWINGS

In order to more fully describe embodiments of the present invention, reference is made to the accompanying drawings. These drawings are not to be considered limitations in the scope of the invention, but are merely illustrative.

FIGS. 3–9 structural diagrams of various tip shapes that may be used in the embodiments of the present invention.

DETAILED DESCRIPTION OF SPECIFIC EMBODIMENTS

The description above and below and the drawings of the present document focus on one or more currently preferred embodiments of the present invention and also describe some exemplary optional features and/or alternative embodiments. The description and drawings are for the purpose of illustration and not limitation. Those of ordinary skill in the art would recognize variations, modifications, and alternatives. Such variations, modifications, and alternatives are also within the scope of the present invention. Section titles are terse and are for convenience only.

Figure 1:
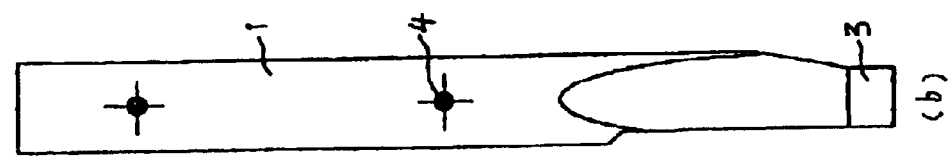
FIG. 1 is the structural diagram of the existing SW Micro Welder's Electrode. Part (a) shows the front view, while part (b) shows the right view.
Figure 1:
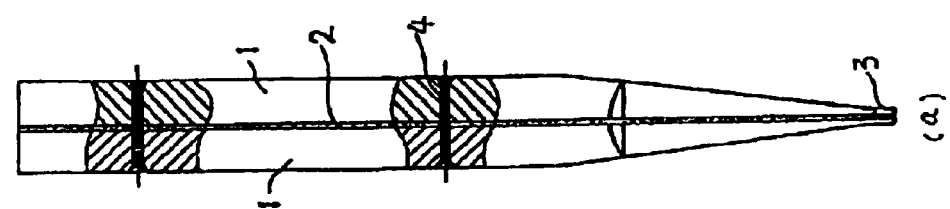

FIG. 1 shows the existing version of the SW Micro-Welder's Electrode, which consists of two electrodes (1) with a layer of insulation (2) between them, a tip (3), and insulating rivets (4) that hold the electrodes together.

Figure 2:
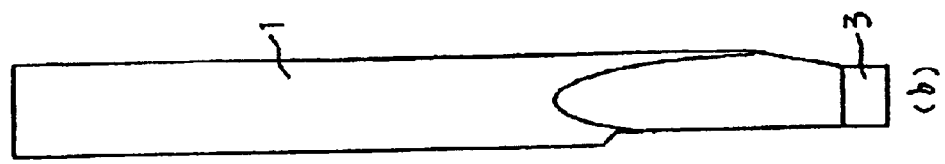
FIG. 2 is the structural diagram of an embodiment of the present invention, where part (a) shows the front view, while part (b) shows the right view.
Figure 2:
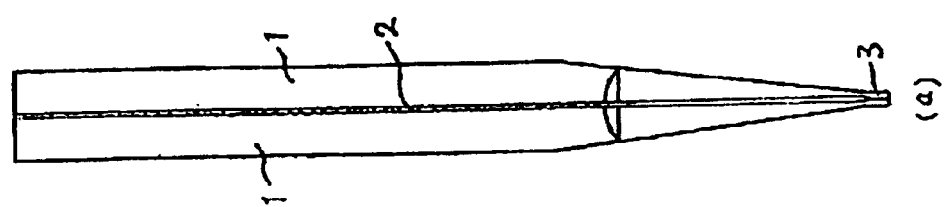

According to FIG. 2, an embodiment of the present invention is shown comprising of two parallel electrodes (1), insulation (2) between the electrodes that also functions to hold the invention together and to keep the electrodes apart, and an electrode tip (3) where the ends of the electrodes curve together and came into contact. The electrodes (1) themselves are made from high temperature-resistant metal materials such as tungsten, molybdenum and their alloys, etc. The insulation (2), which fills most of the space between the electrodes where they are separated, may be made from a thermosetting insulating chipbonder. In this embodiment, the distance between the parallel and separated portion of the electrodes measures between 0.02 and 0.15 mm. The tip (3) may be made of the same material that the electrodes are made of. Where the ends of the electrodes meet at the tip, the mutual Ohm contact resistance is ordinarily 200 milliohms or less.

According to FIGS. 3–9, embodiments of the present invention show that the tip of the electrode may have a variety of shapes. In all of the figures, the ends of the electrodes curve together and form a mutual Ohm contact. In addition, in each of FIGS. 3–9, the embodiment comprises of parallel electrodes (1), chipbonder insulation (2), an electrode tip (3), and a welded workpiece (5). The welded workplace may consist of, among other things, enameled wires, bare wires, sheet metal, and metal tapes.

According to the embodiment shown in FIG. 3, the end of the electrode tip is a flat plane. This tip may be used to weld various bare wires, sheet metal, and metal tapes. However, this tip does not directly weld enameled wires.

According to the embodiment shown in FIG. 4, the end of the electrode tip is a convex arc. This shape reduces the damage that may occur if excessive pressure is applied on enameled or bare wires, sheet metal, or tapes.

According to the embodiment shown in FIG. 5, the end of the electrode tip is an incline. Here, the end of the electrode tip is an inclined plane, two sides of which are perpendicular to the lengthwise edges of the electrode. From the side view that FIG. 5 provides, one edge of the inclined plane may be seen to form a corner that is less than 90°. This edge may be used to cut off the welded insulation with ease.

According to the embodiments of FIGS. 6 and 7, the end of the electrode tip may be either V-shaped with the center recessed into the electrode, or it may be a concave arc. The two figures illustrate that the axis of the V-shape or concave arc may be perpendicular to the plane of either the front or the side view. In either case, the sides of the arc or V-shape hold one or more wires together at the center of the electrode tip during welding.

According to the embodiment of FIG. 8, the tip of the electrode is shaped as a cuneiform, wherein the center of the tip is a flat plane that is perpendicular to the plane of the front and side views, but two or more edges of the tip are chamfered. The end of the tip may be described as a convex V-shape that has had the point of the V-shape flattened. The contact area of the electrode is therefore reduced. Reducing the contact area also reduces the weld force, which makes it easier to weld thicker diameter enameled or bare wires as well as thicker sheet metal or metal tape.

According to the embodiment of FIG. 3(g), the insulation may extend all the way to the tip of the electrode. In this figure, the ends of the electrodes do not curve together and insulation lies between the two electrodes for their entire length. The electrode tips are therefore mutually separated and insulated. The end of the electrode tip in this figure may be shown to be a plane perpendicular to the plane of both the front and side views. This type of tip would be useful only for welding bare wires, sheet metal and metal tapes.

According to the embodiment of FIG. 9, the tip of the electrode may be part plane shaped and part arc shaped. This makes it easier to cut welded enamel wires using the edge of the plane shape while reducing damage to enameled wires on the arc side of the electrode tip. The arc side also increases the stability of welding joints.

Throughout the description and drawings, example embodiments are given with reference to specific configurations. It will be appreciated by those of ordinary skill in the art that the present invention can be embodied in other specific forms. Those of ordinary skill in the art would be able to practice such other embodiments without undue experimentation. The scope of the present invention, for the purpose of the present patent document, is not limited merely to the specific example embodiments of the foregoing description, but rather is indicated by the appended claims. All changes that come within the meaning and range of equivalents within the claims are intended to be considered as being embraced within the spirit and scope of the claims.

What is claimed is:

1. A micro-welding electrode comprising:
   a) two integrated electrodes, said electrodes are made from high-temperature-resistant metal materials;
   b) a gap between said electrodes;
   c) an insulation in said gap between said electrodes, wherein said insulation has a plurality of functions of agglutination, fixation, insulation and separation;
   d) wherein said electrodes have a tip, at said tip the electrodes are in mutual contact, and a remainder of the electrodes is separated by the insulation.

2. The micro-welding electrode according to claim 1, wherein the insulation is an insulating surface mount adhesive.

3. The micro-welding electrode according to claim 1, wherein the mutual contact of the tip of the electrodes has a contact resistance less than or equal to 200 milliohms.

4. The micro-welding electrode according to claim 1, wherein the tip has one or more sides having a shape selected from the group consisting of plane type, arc side type, one side is plane type and one side is arc side type, incline type, V-type, concave arc type, and cuneiform type.

5. The micro-welding electrode according to claim 3, wherein the tip has one or more sides having a shape selected from the group consisting of plane type, arc side type, one side is plane type and one side is arc side type, incline type, V-type, concave arc type, and cuneiform type.

6. The micro-welding electrode according to claim 1, wherein the gap between the electrodes has a width of 0.02–0.15 mm.

7. The micro-welding electrode according to claim 3, wherein the gap between the electrodes has a width of 0.02–0.15 mm.

* * * * *